(12) United States Patent
Muller et al.

(10) Patent No.: US 8,095,092 B2
(45) Date of Patent: Jan. 10, 2012

(54) POWER EFFICIENT TRANSMITTER WITH HIGH DYNAMIC RANGE

(75) Inventors: Jan-Erik Muller, Ottobrunn (DE); Bernhard Sogl, Unterhaching (DE); Wolfgang Thomann, Munich (DE)

(73) Assignee: Infineon Technologies AG, Neubiberg (DE)

( * ) Notice: Subject to any disclaimer, the term of this patent is extended or adjusted under 35 U.S.C. 154(b) by 786 days.

(21) Appl. No.: 12/146,979

(22) Filed: Jun. 26, 2008

(65) Prior Publication Data
US 2009/0322421 A1    Dec. 31, 2009

(51) Int. Cl.
*H01Q 11/12* (2006.01)
(52) U.S. Cl. ...... 455/127.1; 455/303; 455/304; 455/306; 455/273; 330/295; 330/277; 330/311
(58) Field of Classification Search .......... 455/127.1, 455/303, 304, 306, 273; 330/295, 277, 311
See application file for complete search history.

(56) References Cited

U.S. PATENT DOCUMENTS

| | | | | |
|---|---|---|---|---|
| 4,994,773 A | * | 2/1991 | Chen et al. | 333/164 |
| 5,537,680 A | * | 7/1996 | Bruno | 455/15 |
| 6,140,247 A | * | 10/2000 | Muraoka et al. | 438/743 |
| 6,549,560 B1 | * | 4/2003 | Maiuzzo et al. | 375/136 |
| 6,967,543 B2 | * | 11/2005 | Ammar | 333/26 |
| 7,853,290 B2 | * | 12/2010 | Itkin et al. | 455/552.1 |

OTHER PUBLICATIONS

"CDMA2000 PCS/Cell SiGe HBT Load Insensitive Power Amplifiers", Giuseppe Berretta, Domenico Cristaudo and Salvatore Scaccianoce, IEEE, 2005, 4 pgs.
"Phase-Only Predistortion for LINC Amplifiers With Chireix-Outphasing Combiners", Ahmed Birafane and Ammar B. Kouki, IEEE Transactions on Microwave Theory and Techniques, vol. 53, No. 6, Jun. 2005, pp. 2240-2250.

* cited by examiner

*Primary Examiner* — Sanh Phu
(74) *Attorney, Agent, or Firm* — Eschweiler & Associates, LLC

(57) ABSTRACT

One embodiment of the present invention relates to a method for transistor matching. The power transmitter comprises a first, second, and third amplification path. The paths are selectively activated and deactivated to output a received signal with high efficiency and linearity. The first amplification path is configured to receive a first signal and output a first amplified signal to a first port of a output power combiner when activated and provide an impedance that results in a high reflection factor when deactivated. The second amplification path is configured to receive a second signal with 90° phase shift with respect to the first signal and output a second amplified signal to a second port of the combiner when activated and provide an impedance that results in a high reflection factor when deactivated. The third amplification path is configured to receive a third signal and output a third amplified signal to a third port of the output power combiner when activated and provide an impedance that matches the output impedance when deactivated.

25 Claims, 11 Drawing Sheets

FIG. 12

POWER EFFICIENT TRANSMITTER WITH HIGH DYNAMIC RANGE

FIELD OF INVENTION

The present invention relates generally to transmission of radio frequency waves, and more particularly to a power-efficient transmitter with a wide dynamic output range.

BACKGROUND OF THE INVENTION

Radio frequency communication devices (e.g., cell phones) rely upon power amplifiers to convert an input signal with a small amount of energy into a similar output signal with a larger amount of energy. Efficiency and linearity are both factors in the performance of power amplifiers in modern wireless systems. An ideal power amplifier would be a totally linear device, meaning that as a drive signal to the amplifier is increased, the output signal delivered by the amplifier also increases in a corresponding manner, until a point is reached where some part of the amplifier becomes saturated and cannot produce any more output.

In practice, there is a tradeoff between efficiency and linearity that makes it difficult to satisfy both factors at the same time. At maximum output power and highest efficiency, the amplifier linearity is often so low that only signals with a constant envelope can be transmitted. At lower output powers, the linearity increases, but the power efficiency decreases.

The linear amplification with nonlinear components (LINC) method offers a method for amplification with good linearity and high efficiency. However, the LINC method has disadvantages in that its efficiency is poor at small signal amplitudes and that it is strongly affected by impedance mismatching of the antenna.

The poor efficiency at small signal amplitudes is especially problematic for multiband or multimode communication devices. Multiband phones allow users to communicate with multiple distinct types of communication systems. Most often, the different communication systems require different modulation formats having widely varying dynamic ranges. Therefore, to adapt the transmission of data (e.g., audio, video, etc.) for multiband systems it is necessary for transmitters to switch between the various modulation methods and thus between the different required standardized transmission power levels. For example, multiband systems must switch between the high amplitude transmission required for GMS, and the low amplitude transmission that frequently occurs in the case of third generation (3G) devices and long term evolution (LTE) modulations.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a power efficient transmitter with high dynamic range. The power transmitter comprises a first, second, and third amplification path. The paths are selectively activated and deactivated to output a received signal with high efficiency and linearity. The first amplification path is configured to receive a first signal and output a first amplified signal to a first port of an output power combiner when activated, and provide an impedance that results in a high reflection factor when deactivated. The second amplification path is configured to receive a second signal, having a 90° phase shift with respect to the first signal, and output a second amplified signal to a second port of the output power combiner when activated. The second amplification path also provides an impedance that results in a high reflection factor when it is deactivated. The third amplification path is configured to receive a third signal and output a third amplified signal to a third port of the output power combiner when activated, and provide an impedance that results in an impedance that matches the output impedance of the output power combiner when deactivated. Other embodiments and methods are also disclosed.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIG. 12 is a comprehensive table describing different operating modes of the high efficiency power amplifier of FIG. 11.

DETAILED DESCRIPTION OF THE INVENTION

Figure 1:
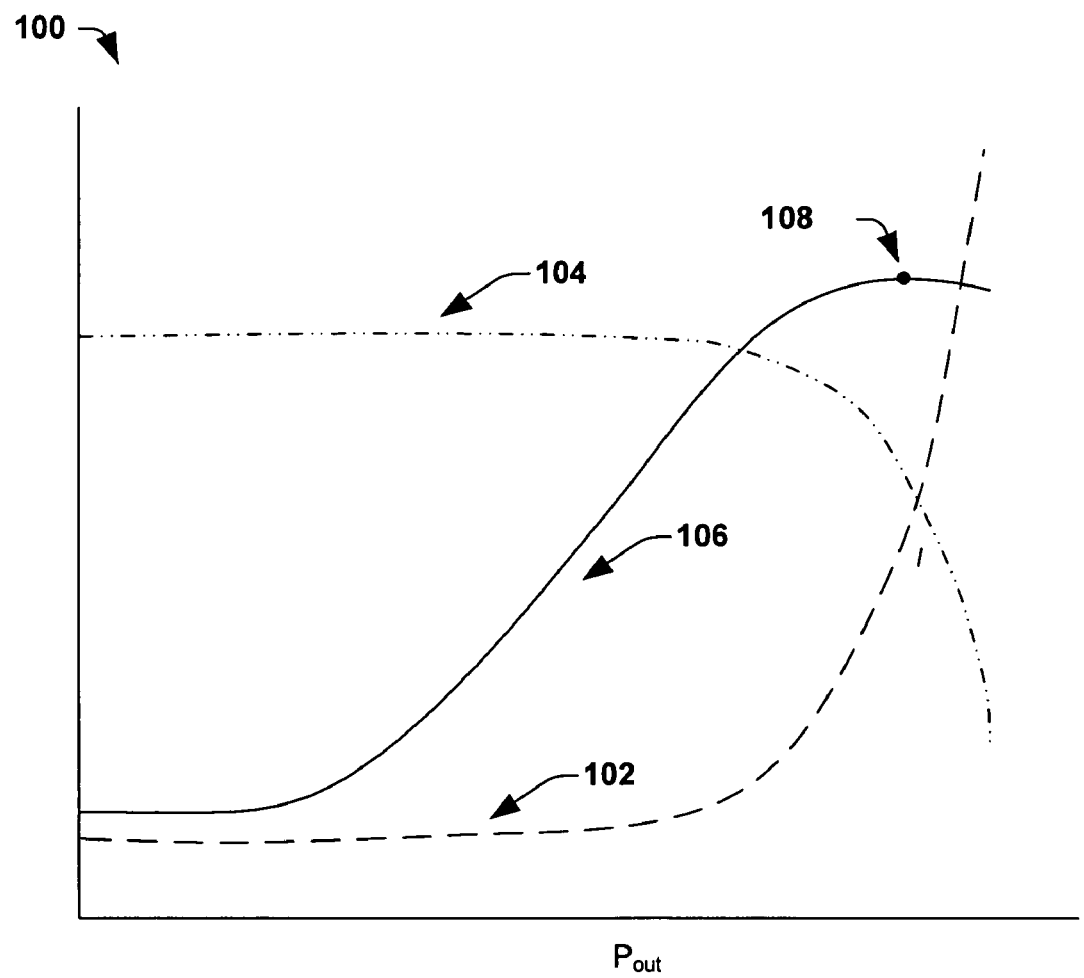
FIG. 1 is a graph showing electrical characteristics of power added efficiency (PAE), nonlinearity, and gain for an exemplary amplifier.

The present invention will now be described with reference to the attached drawing figures, wherein like reference numerals are used to refer to like elements throughout, and wherein the illustrated structures and devices are not necessarily drawn to scale.

FIG. 1 shows an exemplary graph 100 showing electrical characteristics of an exemplary power amplifier. In the graph 100 curves are shown representing the non-linearity 102, the gain 104, and the power added efficiency (efficiency) 106 of the exemplary power amplifier as a function of the output power, $P_{out}$, of the amplifier. In the present invention, the efficiency of the amplifier is of particular importance. For an amplifier having a given size, the efficiency curve 106 is optimized at an associated output power. In FIG. 1, the amplifier is sized such that the efficiency is optimized at a $P_{out}$ given by point 108. The size of the amplifier can be adjusted to change the $P_{out}$ at which the efficiency is optimized. However, operation of an amplifier away from its optimized operating point (i.e., at a $P_{out}$ above or below the optimized value) causes an immediate lose of efficiency. For example, operation of an amplifier at an output power of 3 dB below its optimized operating point causes a drop in efficiency by about 25%. For a LINC amplifier in particular the efficiency is high only when the amplifier is at high power output levels. Therefore, the amplifier does not provide a high efficiency over a large dynamic range.

Figure 2:
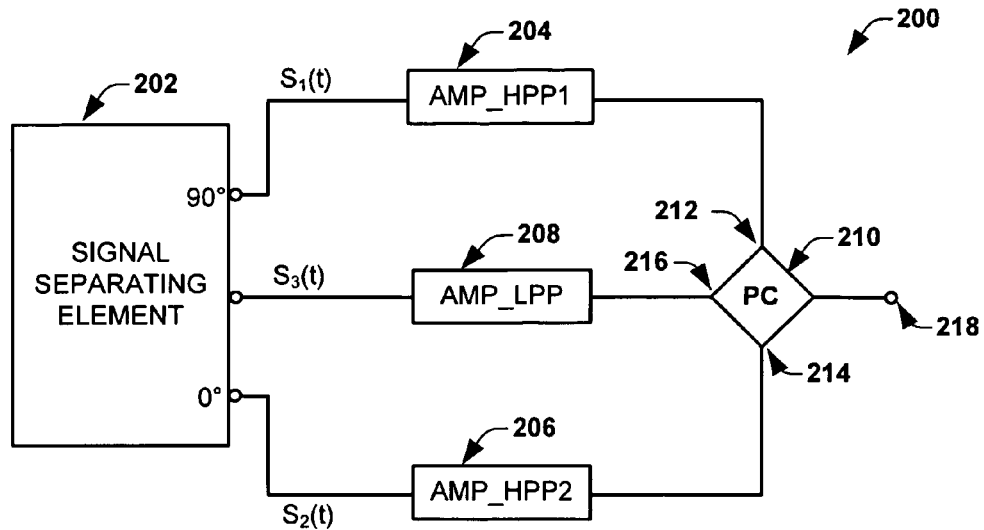
FIG. 2 is a block diagram illustrating a high efficiency power amplifier according to a first embodiment of the present invention.

FIG. 2 shows a transmitter 200 in conjunction with a first embodiment of the present invention. A first amplification path (AMP_HPP1) 204 and a second amplification path (AMP_HPP2) 206, are respectively configured to receive a first signal $S_1(t)$ and a second signal $S_2(t)$ from a signal separator 202 or other component. The signals, $S_1(t)$ and $S_2(t)$, are phase shifted by 90° degrees with respect to each other. A third amplification path (AMP_LPP) 208 is configured to receive a third signal $S_3(t)$ from the signal separator 202. Activating or deactivating different combinations of the three amplification paths, 204, 206, 208, respectively provides outputs to a first port 212, a second port 214, or a third port 216 of an output power combiner 210. The output power combiner 210 receives the outputs from the activated amplification paths and outputs an amplified version of the original signal to an output node 218. For example, for low power operation the third amplification path (AMP_LPP) 208 is activated and the first amplification path (AMP_HPP1) 204 and the second amplification path (AMP_HPP2) 206 are deactivated, thereby providing an amplified version of the third signal $S_3(t)$ to the output power combiner 210.

As will be further discussed later, deactivation of the first, second, and third amplification paths provide impedances configured to isolate the different amplification paths. When deactivated the first and second amplification paths, 204 and 206, provide an impedance mismatch with respect to the output impedance of the output power combiner 210 resulting in a high reflection factor. In alternative operation modes, when the third amplification path 208 is deactivated it provides an impedance which matches the output impedance of the power combiner reducing reflection at the output port of the output power combiner 210.

The transmitter architecture of FIG. 2 effectively isolates (e.g., by switches or selective amplification path impedance) the operating (i.e., activated) amplification paths from the non-operating (i.e., deactivated) amplification paths to keep the transmitter efficiency high over a wide dynamic range. As a result, the output at lower power has a higher efficiency than that achieved using a traditional LINC amplifier, thereby allowing a reasonably high efficiency from high power to low power. In the transmitter shown in FIG. 2 the amplifiers are load insensitive and cumulatively provide a high power efficiency when the transmitter is operated in High Power mode (e.g., AMP_HPP1 and AMP_HPP2 activated and AMP_LPP deactivated). In other embodiments of a transmitter according to the present invention, load insensitive operation and high efficiency is achieved over a wider range of transmitter output power levels by operating the transmitter in additional operating modes.

Figure 3:
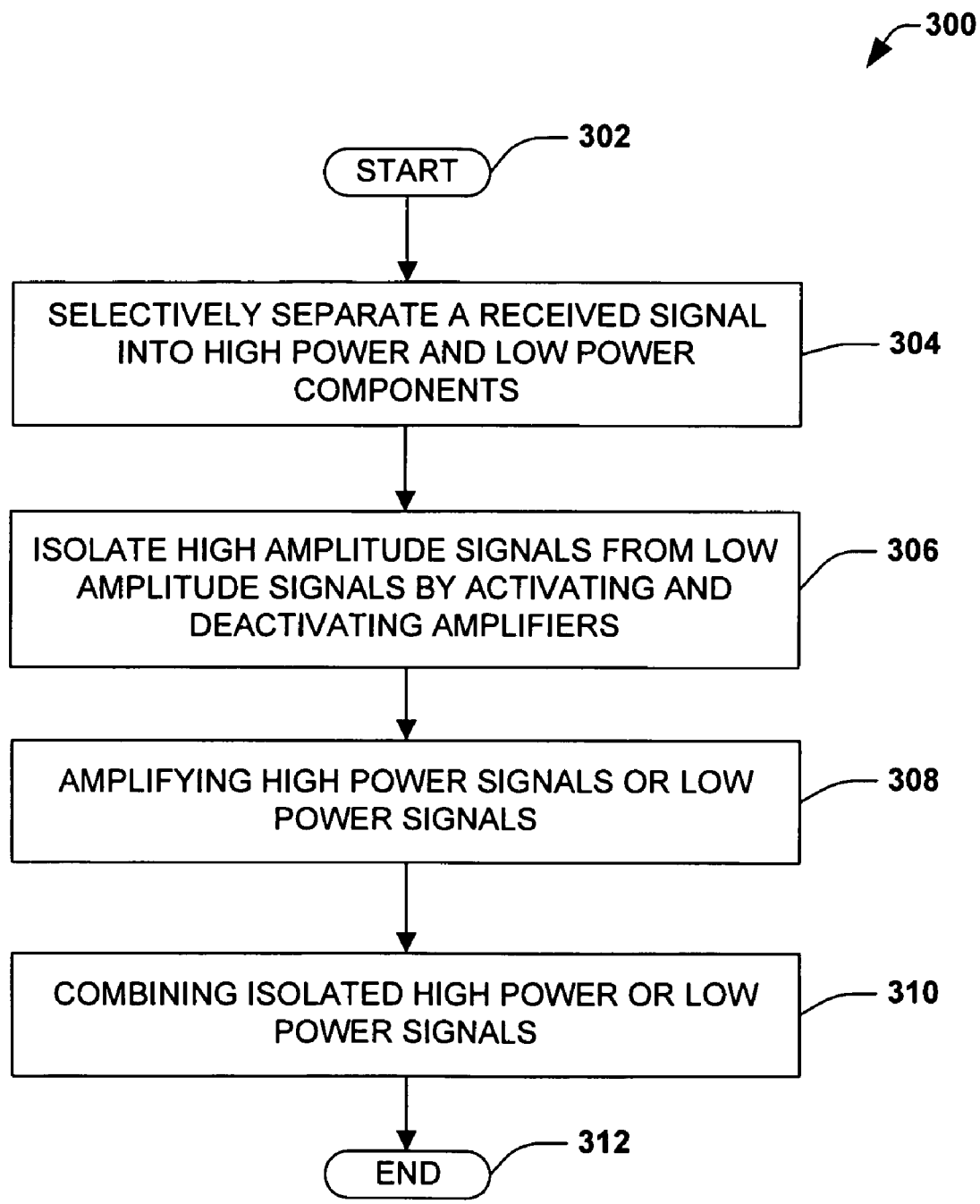
FIG. 3 is a flow chart illustrating a method of amplifying a received signal with high efficiency over a broad dynamic range.

FIG. 3 illustrates a method 300 of amplifying a received signal with high efficiency over a broad dynamic range according to one embodiment of the invention. The transmitter architecture of FIG. 2 can be effectively used to perform the method in one embodiment. While method 300 of this disclosure is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

At 302 a received signal is separated into high power components and low power components. The separation can be performed by a separation element such as a signal separator, a directional coupler, etc. Further, the threshold by which a component is considered high power or low power may be fixed or be programmable.

In one embodiment, the high power signals are separated from the low power signals by selectively activating and deactivating amplifiers located within the first, second, or third amplification paths at 304.

At 306 two or more of the high power signal components or one or more of the low power signal components are isolated from the other components by the activated amplifiers. In one particular embodiment, a high power signal component amplifier is activated concurrently only with other high power signal component amplifiers and a low power signal component amplifier is activated concurrently only with other low power signal component amplifiers.

At 308 the activated amplifiers operate to amplify a signal component in its respective amplification path.

The isolated high power signal components or the isolated low power signal components are combined to form the received signal amplified at 310. In the embodiment of FIG. 2 the high power signal components are combined to form a single output signal in high power operation while the low power component is not combined with another signal component in low power operation. In other embodiments multiple high power signals are combined or multiple low power signals are combined, by one or more power combiners, to form the amplified received signal at 310.

Figure 4:
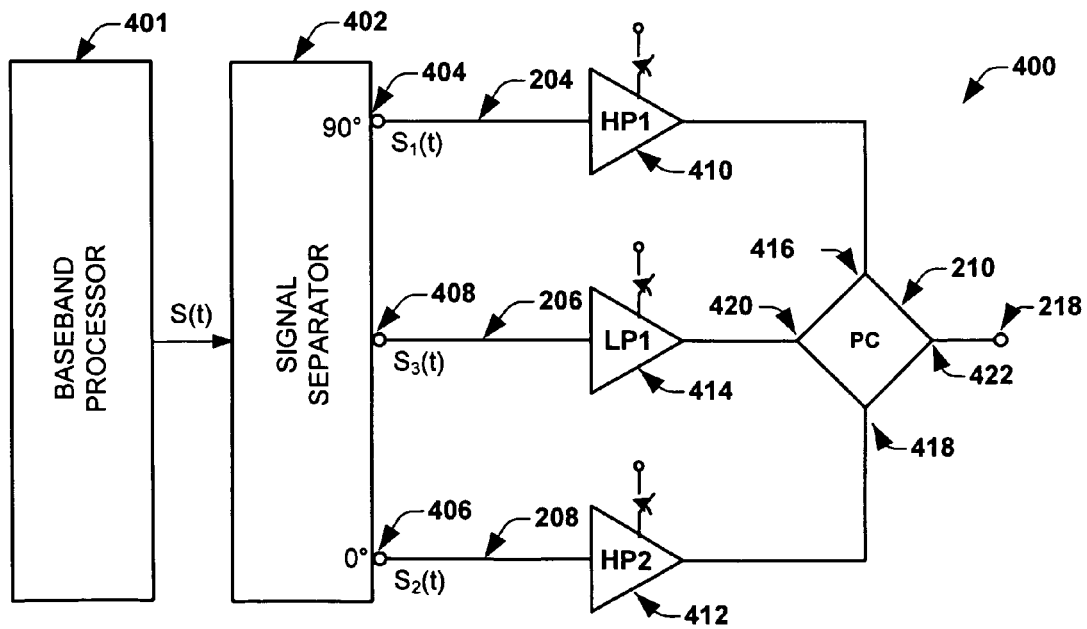
FIG. 4 is a block diagram illustrating a high efficiency power amplifier according to an alternative embodiment of the present invention.

FIG. 4 sets forth a more detailed example of an additional embodiment of the transmitter architecture shown in FIG. 2. In FIG. 4 the first and second amplification paths 204 and 208 are high power amplification paths. Each high power amplification path comprises a first high power non-linear amplifier, 410 and 412, configured to receive high amplitude phase-modulated constant envelope signals $S_1(t)$ and $S_2(t)$, from a first input node 404 and a second input node 406, shifted by θ(t) and −θ(t) with respect to an amplitude-modulated input signal S(t) received from a baseband processor 401. The third amplification path 206 comprises a non-linear low power amplifier 414 configured to receive an I/Q low amplitude signal from a third input node 408. In one exemplary embodiment the first input node 404 is a 0° phase input and the second input node 406 is a 90° phase input.

During high power operation the high power amplifiers 410, 412 are activated and the low power amplifier 414 is deactivated. In one embodiment, such activation or deactivation is performed by employing a switch to connect or disconnect a supply voltage to the respective amplifier. However, other methods of activating/deactivating such amplifiers may be employed and are contemplated as falling within the scope of the invention. The phase modulated signals, $S_1(t)$ and $S_2(t)$, are amplified by the first and second high power amplifiers, 410 and 412, and are output to the output power combiner 210. Amplified signal $S_1(t)$ is received at the 0° phase port 416 of the out power combiner 210 and amplified signal $S_2(t)$ is received at the 90° phase port 420. The output power combiner 210 vector sums amplified signal $S_1(t)$ and amplified signal $S_2(t)$ to generate an amplified version of the original signal.

During low power operation the low power amplifier 414 is activated and the high power amplifiers 410, 412 are deactivated. The low power signal $S_3(t)$ is amplified and is output to the output power combiner 210. Amplified $S_3(t)$ is received at the ISO port 420 of the output power combiner 210.

Figure 5:
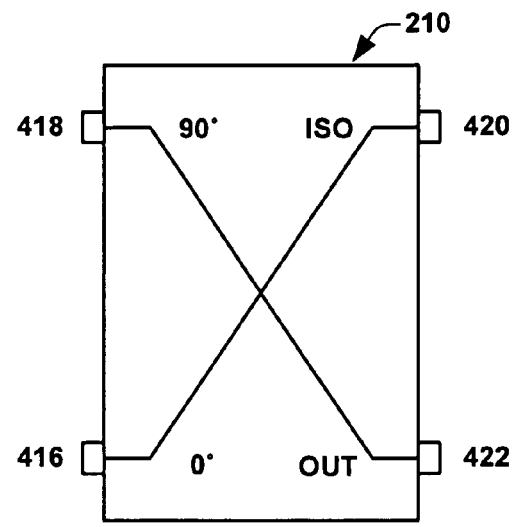
FIG. 5 illustrates the ports and cross over transmission lines of a four port hybrid power combiner.

FIG. 5 shows a hybrid power combiner 210 according to one embodiment. The signal amplification of FIGS. 2 and 4 depends upon the properties of the power combiner 210 to provide linear behavior and good power efficiency. The hybrid power combiner is one example a number of power combiners that can be used in conjunction with the present invention. The hybrid power combiner 210 is a four port device that relies upon transmission line coupling to either equally split an input signal with a resultant 90° phase shift between output ports or to combine two signals while maintaining a high isolation between the ports.

In usual hybrid power combiner operation, when power is introduced at the 0° phase port 416 and the 90° phase port 418 the signals will be coupled at the cross over transmission line and output to the OUT port 422. Reflections from mismatches sent back from the OUT port 422 will flow directly to the ISO port 420. When power is introduced at the ISO port 420 the signal will be coupled at the cross over transmission line and half of the power will be output to the 0° phase port 416 and the other half will be output to the 90° phase port 418. Reflections from the mismatches sent back from the 0° phase port 416 and the 90° phase port 418 will flow directly to the OUT port 422. Throughout the detailed description, the combiners are shown as a 90° hybrid power combiner, however, it should be appreciated that the present invention may be initiated using other types of power combiners (e.g., a ratrace power combiner, etc.).

Figure 6:
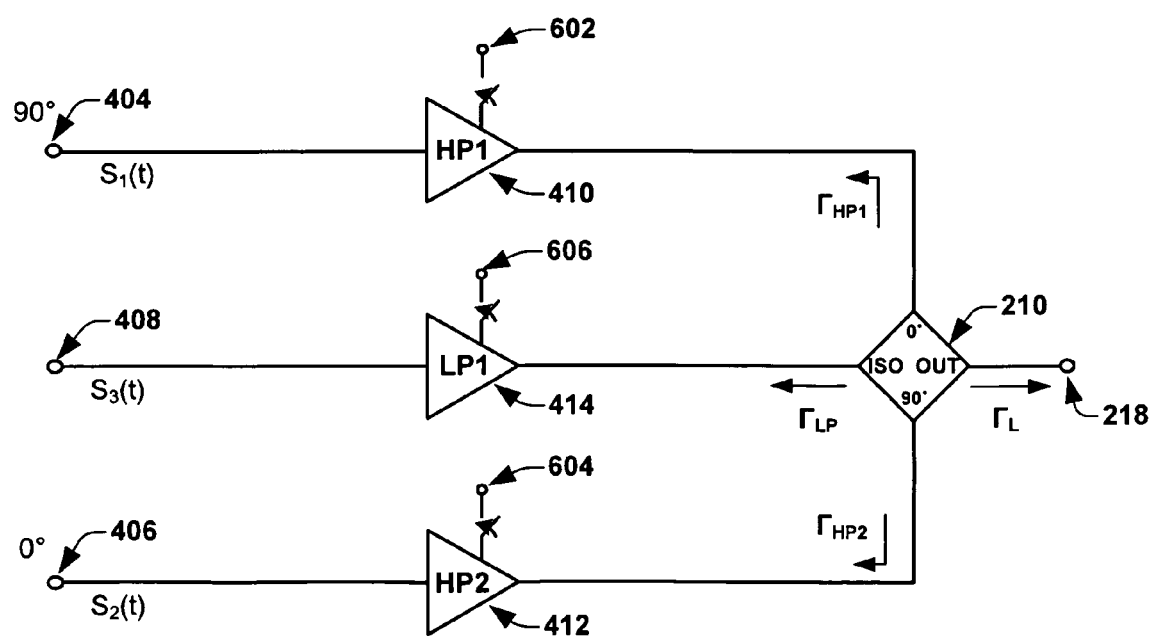
FIG. 6 is a circuit diagram showing the reflection coefficients when looking back towards the amplifiers of FIG. 4 for high and low amplitude operations.

Referring to FIG. 6, in one embodiment the transmitter can be operated in two modes shown in Table 1. For high amplitude operations, amplifiers 410 and 412 are both activated and amplifier 414 is deactivated. For low amplitude operations, low power amplifier 414 is activated and both amplifiers 410 and 412 are deactivated.

TABLE 1

| Mode | 410 | 412 | 414 |
|---|---|---|---|
| High Signal Amp | activated | activated | deactivated |
| Small Signal Amp | deactivated | deactivated | activated |

FIG. 6 shows a more detailed example of an embodiment relating to high amplitude operation. For high amplitude operation, amplifiers 410 and 412 are activated and amplifier 414 is deactivated. The low power amplifier 414 is designed to have a relatively low reflection coefficient $\Gamma_{LP}$ in its deactivated state (e.g., the output reflection coefficient of the low power amplifier matches the output power combiner's output reflection coefficient $\Gamma_L$), therefore maximizing load insensitivity for high power amplifiers (i.e., minimizing the load intake of the power amplifier characteristic). For example, signal $S_1(t)$ is amplified by amplifier 410 and is output to the 0° phase port 416 of the output power combiner 210. Signal $S_2(t)$ is amplified by amplifier 412 and is output to the 90° phase port of the output power combiner 210. The output power combiner 210 will combine the signals of activated amplifiers 410 and 412. Therefore, the transmitter's efficiency is improved over a wide range of output power by activating and deactivating different paths of the transmitter.

FIG. 6 also shows a more detailed example of an embodiment relating to low amplitude operation. For low amplitude operation, amplifiers 410 and 412 are deactivated and amplifier 414 is activated. In the deactivated state, amplifier 410 and amplifier 412 have output impedances that result in relatively high reflection coefficients, $\Gamma_{HP1}$ and $\Gamma_{HP2}$ (e.g., almost the entire signal received at the ISO port is reflected away from the ports connected to amplifiers 410 and 412). For example, a signal $S_3(t)$ is amplified by low power amplifier 414 and received at the ISO port 420 of the output power combiner 210. The received amplified signal $S_3(t)$ is reflected from the 0° phase port 416 and the 90° phase port 418 resulting in almost the entire amount of signal power produced by the low power amplifier 414 to arrive at the OUT port 422 of the output power combiner 210. In all embodiments of the present invention biasing or other methods (e.g., switches) can be used to turn the amplifiers on and off.

Figure 7:
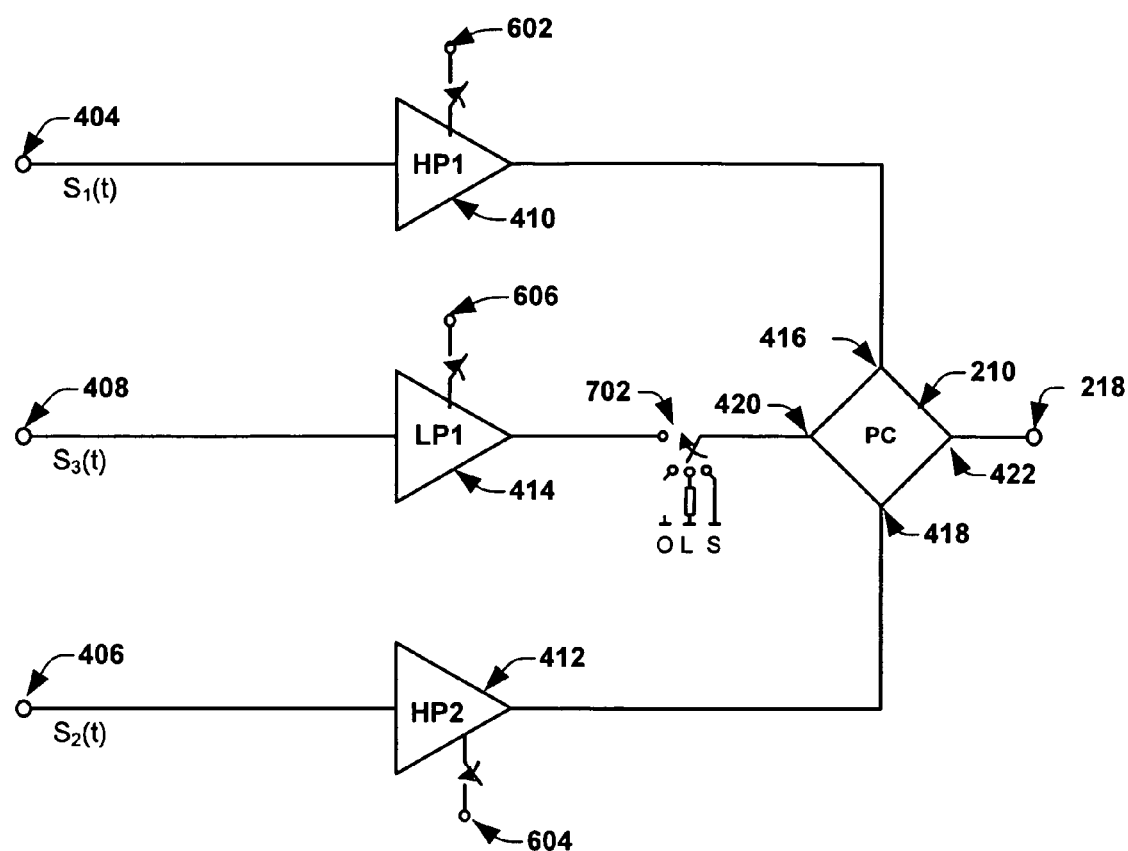
FIG. 7 is a block diagram illustrating a high efficiency power amplifier according to an alternative embodiment of FIG. 4, wherein a changeover switch has been added to the low power path.

FIG. 7 shows an alternative embodiment of the present invention. In FIG. 7 a changeover switch 702 has been added at the input of the ISO port 420 of the output power combiner 210. The changeover switch 702 is configured to provide a matching resistance to the ISO port 420 for situations where matching the output impedance of the combiner 210 and the low power amplifier 414 impedance is difficult to achieve. For operation at high signal amplitudes the changeover switch 702 would be switched to a matching resistance L, a short circuit S, or an open circuit O. For operation at low signal amplitudes the changeover switch 702 would be closed, allowing electrical connection between the low power amplifier 414 and the output power combiner 210. In additional embodiments changeover switches could also be introduced at the input of the 0° phase port 416 and 90° phase port 418 to maximize reflection by improved impedance mismatching.

Figure 8:
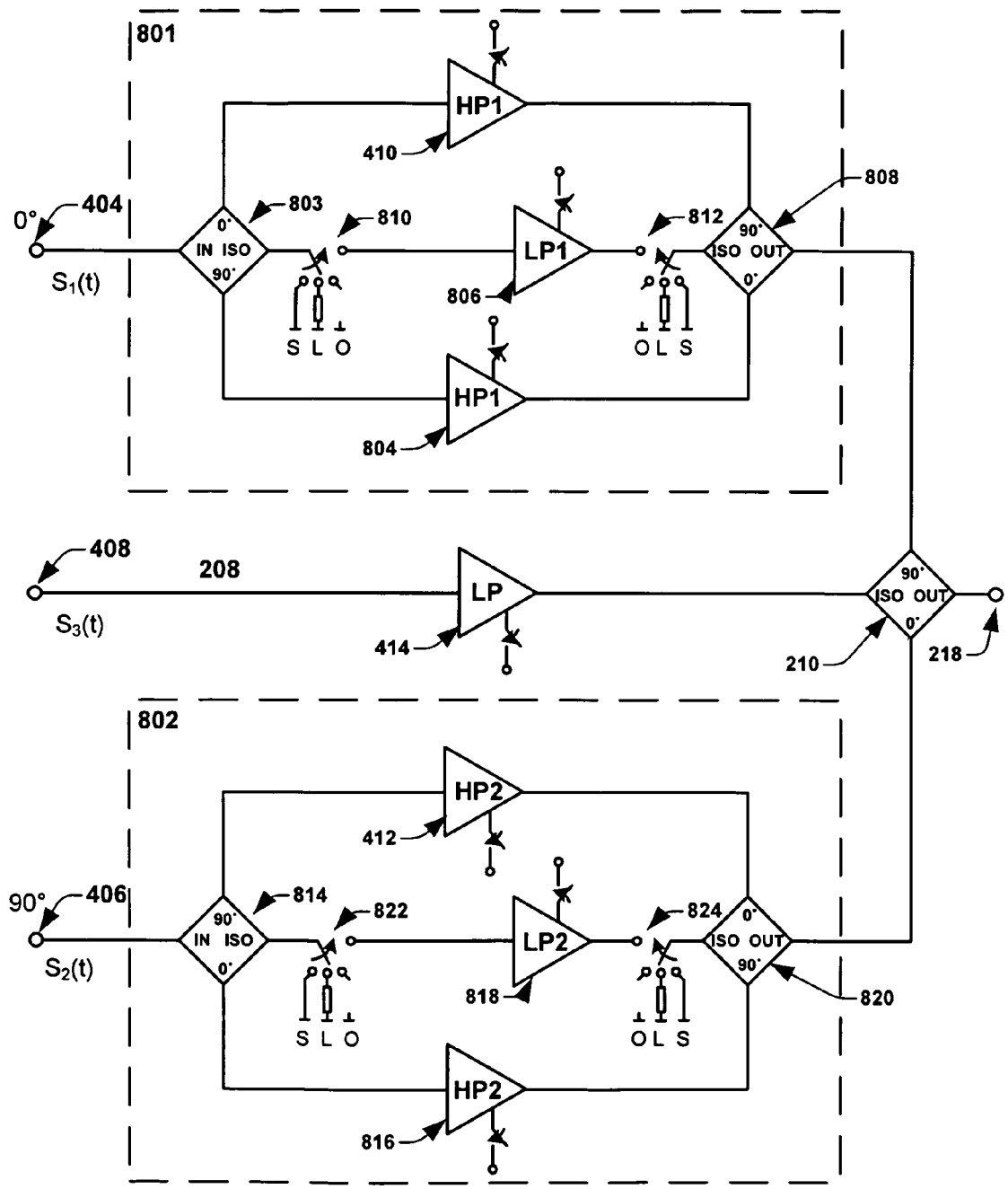
FIG. 8 is a block diagram illustrating a high efficiency power amplifier according to an alternative embodiment of FIG. 4, wherein the amplifiers are set back in several stages.

FIG. 8 shows another exemplary embodiment of the present invention, a transmitter in which the output power is set in several stages, providing very good power efficiency, modulation quality, and load insensitive behavior at the same time. In FIG. 8, the first path 801 and second path 802 are hybrid paths comprising both high power and low power amplifiers.

The first amplification path 801, configured to receive and amplify a first signal $S_1(t)$ from a 0° phase first input node 404, comprises a first power combiner 803 having a first input port IN configured to receive the signal $S_1(t)$. The first power combiner 803 separates the 0° phase input signal into 0° and 90° phase shifted signals. The 0° phase shifted signals are output from a first 0° phase port coupled to the first high power amplifier 410 and the 90° phase shifted signals are output from a first 90° phase port coupled to a second high power amplifier 804. In one embodiment a first isolation port ISO of the first power combiner 802 is coupled to a first low power amplifier 806. A second power combiner 808 has a second isolation port ISO, a second 0° phase port coupled to the first high power amplifier 410, a second 90° phase port coupled to the second high power amplifier 804, and a second output port OUT coupled to the output power combiner 210. In one embodiment, a first switch 810 is connected to the first isolation port ISO and the input of the low power amplifier 806 and a second switch 812 is connected to the output of the low power amplifier 806 and the second isolation port ISO.

The second amplification path 802 is configured to receive and amplify a signal $S_2(t)$ from a 90° phase second input node 406 and comprises a first power combiner 814, a second high power amplifier 816, and a second power combiner 820 configured in the same manner as the first amplification path 801. The second amplification path 802 may also have a first low power amplifier 818, a first switch 822, and a second switch 824 in alternative embodiments.

The signal amplification unit of FIG. 8 can be configured according to four different operation modes, according to one embodiment, to provide a broad range of high efficiency operation as shown in Table 2.

TABLE 2

| Mode | 410 | 804 | 806 | 414 | 412 | 816 | 818 |
|---|---|---|---|---|---|---|---|
| HP Mode 1 | activated | activated | deactivated | deactivated | activated | activated | deactivated |
| HP Mode 2 | activated* | deactivated | deactivated | deactivated | activated* | deactivated | deactivated |
| LP Mode 1 | deactivated | deactivated | activated | deactivated | deactivated | deactivated | activated |
| LP Mode 2 | deactivated | deactivated | deactivated | activated | deactivated | deactivated | deactivated |

*(804, 816) can be activated in place of (410, 412)

The highest power operation mode, HP Mode 1, is achieved by activating all of the high power amplifiers 410, 804, 412, 816 in the first amplification path 801 and the second amplification path 802. The switches 810, 812, 822, 824 ensure that the isolated gates in question are connected to the necessary terminal resistance to provide a high degree of impedance matching (i.e., minimal power loss). The low power amplifiers 414, 806, and 818 are deactivated. This operation mode results in a maximum output power with very good power efficiency, modulation quality, and load insensitive behavior.

A second high power operation mode, HP Mode 2, is achieved by activating one of the high power amplifiers, 410 or 804, in the first amplification path 801 and one of the high power amplifiers, 412 or 816, the second amplification path 802, and deactivating the other high power amplifiers in the first amplification path 801 and the second amplification path 802. The low power amplifiers 414, 806, and 818 are deactivated. In one embodiment, utilizing a power combiner with a 3 bB coupling factor, the second high power operation mode reduces output power of the first high power operation mode by 3 dB.

A first low power operation mode, LP Mode 1, is achieved by deactivating all of the high-power amplifiers 410, 804, 412, 816 in the first amplification path 801 and the second amplification path 802. The switches 810, 812, 822, 824 are closed to establish an electrical connection to the low power amplifiers 806, 818 in the first and second amplification paths, 801 and 802. The low-power amplifiers 806, 818 are activated. Low power amplifier 414 is deactivated. The first low power operation mode offers a lower output power than the high power operation modes.

A second low power operation mode, LP Mode 2, is achieved by activating only the low-power amplifier 414 and deactivating all other amplifiers 410, 804, 412, 816, 806, 818. This configuration results in a very low maximum output power with good efficiency and modulation quality. In an alternative embodiment it would be possible to provide a through connection in place of low power amplifier 414.

An additional embodiment of the present invention can be formed by omitting the low power amplifiers 806 and 818 in the first and second amplification paths, 801 and 802. In yet another embodiment the maximum power is not decreased by 3 bB, allowing switches in the low-power paths to be eliminated because matching is necessary only for the isolated gates in both the activated and deactivated states, and there is no need for open or short.

Figure 9:
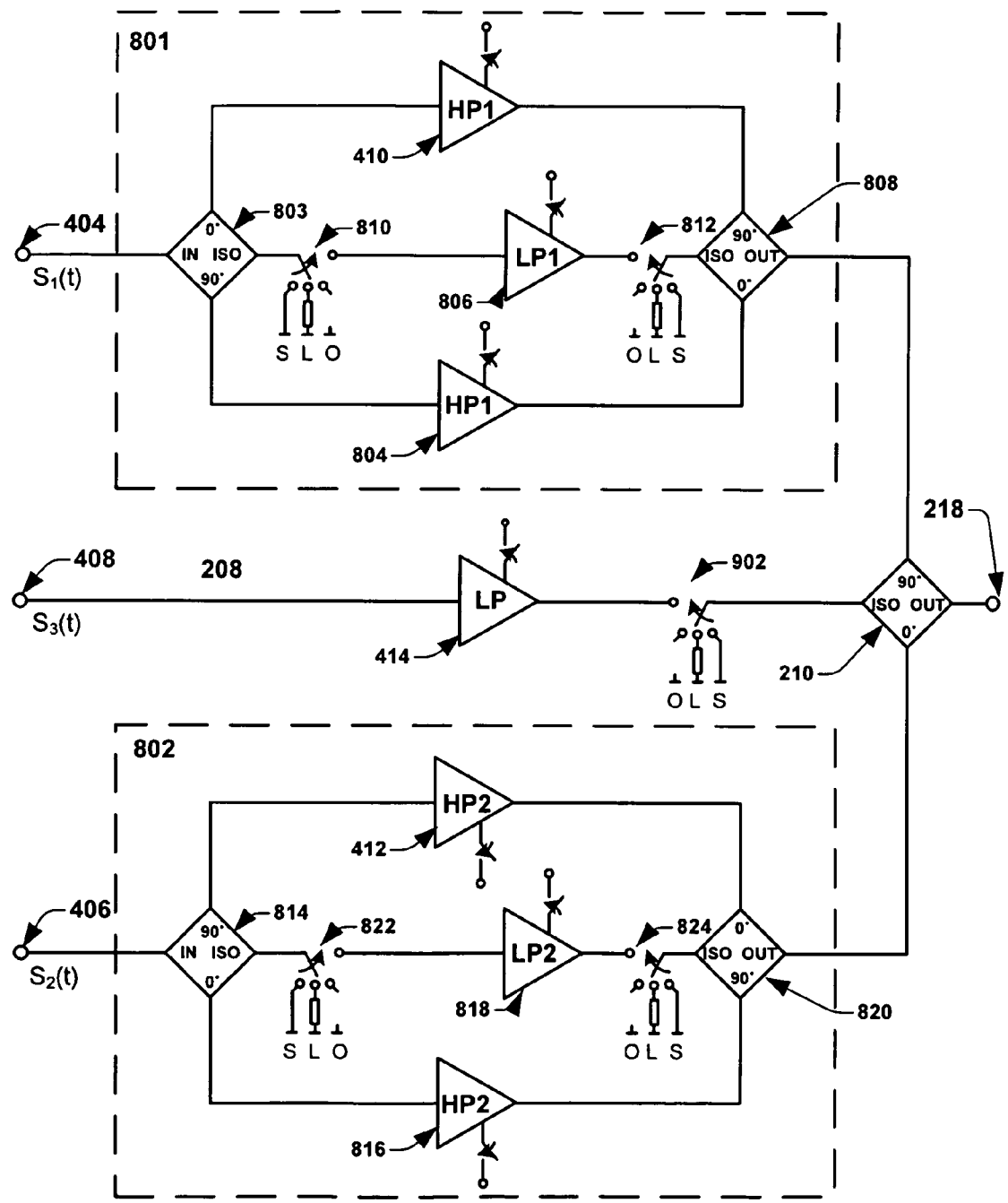
FIG. 9 is a block diagram illustrating a high efficiency power amplifier according to an alternative embodiment of FIG. 8, wherein a changeover switch has been added to the low power path.

FIG. 9 shows an alternative embodiment of the present invention as shown in FIG. 8. In FIG. 9 a changeover switch 902 has been added at the ISO port of the output power combiner, to provide a matching resistance to the ISO port for situations wherein matching the antenna impedance and impedance associated with low power amplifier 414 is difficult to achieve.

Figure 10:
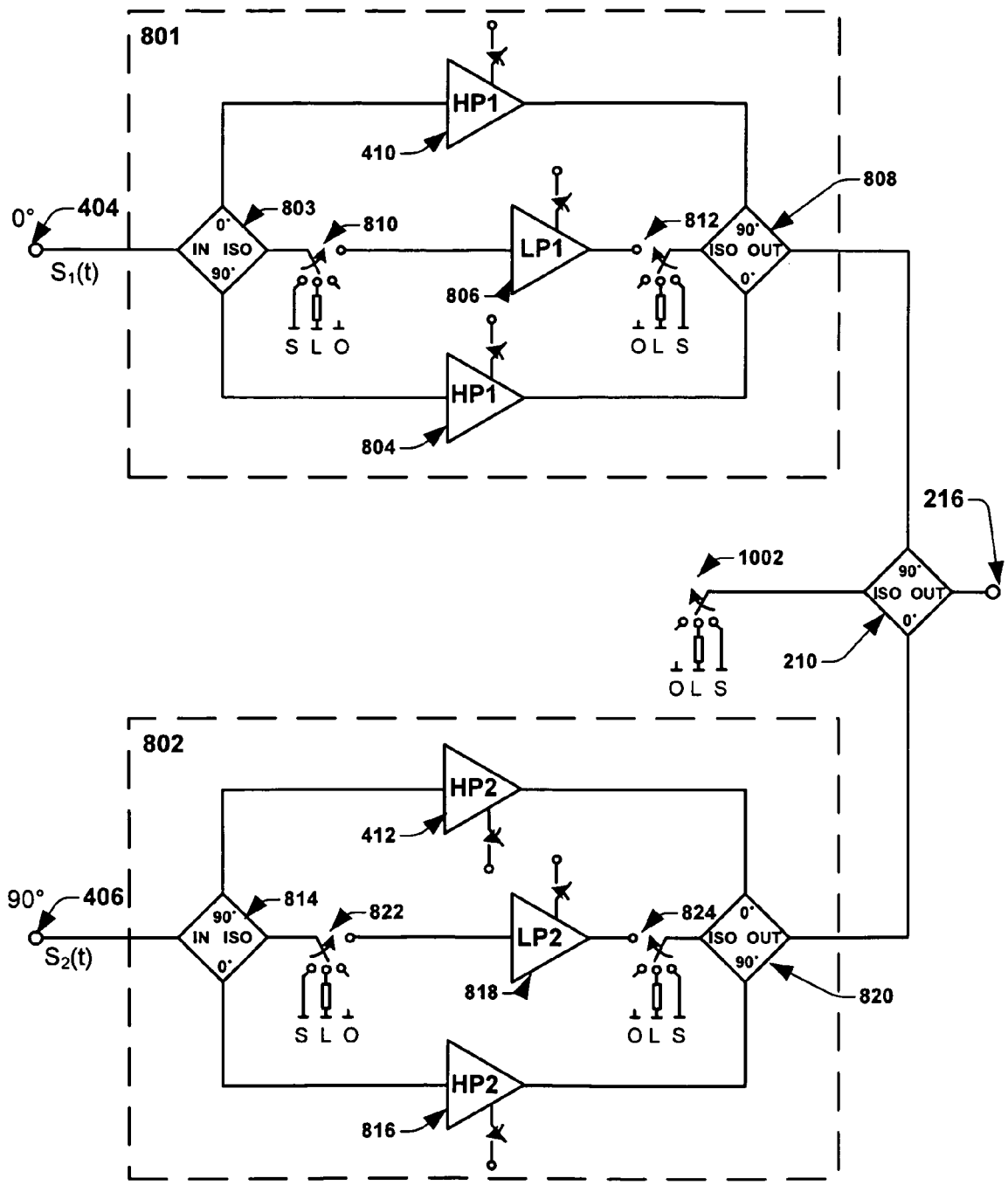
FIG. 10 is a block diagram illustrating a high efficiency power amplifier comprising two input nodes.

FIG. 10 shows an alternative embodiment of the present invention configured to achieve load impassive behavior over a broad range of power output for a two input amplifier. The first input node 404 is phase shifted with respect to the second input node 406. In one embodiment the phase shift between the first input node 404 and the second input node 406 is 90°. As in FIG. 9, the first amplification path 801 and the second amplification path 802 are hybrid paths. A changeover switch 1002 is configured at the ISO port of the output power combiner 210 to provide an impedance matching at the output. The various amplifiers can be switched on and off to achieve different operation modes and output powers in a manner similar to that described in table 2.

Figure 11:
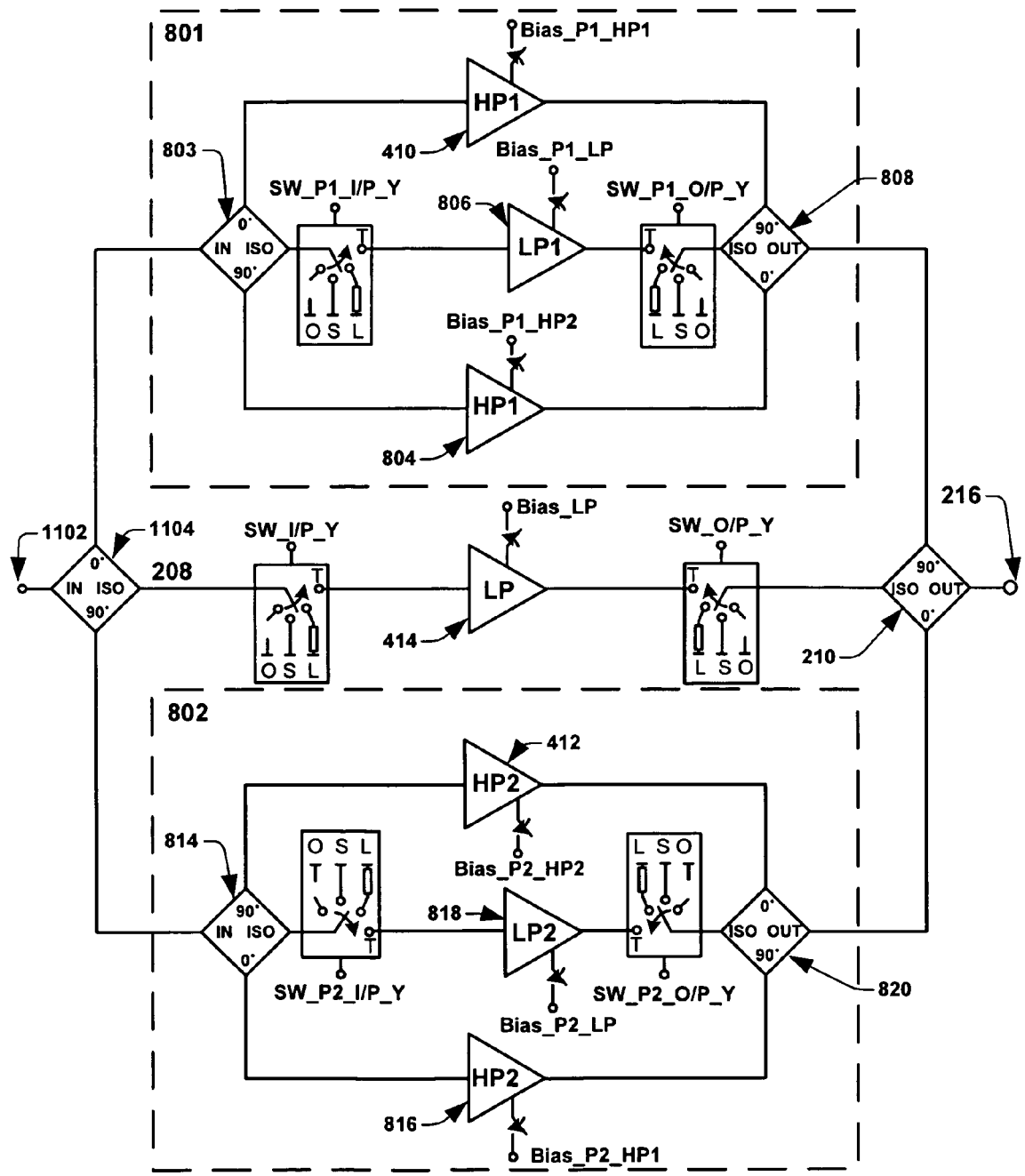
FIG. 11 is a block diagram illustrating a high efficiency power amplifier comprising a single input node.

FIG. 11 shows an alternative embodiment of the present invention by which a signal received from a single input node 1102 is amplified at high efficiency over a broad range of output power by a plurality of operation modes. FIG. 11 utilizes an input power combiner 1104 to separate an input signal. The transmitter of FIG. 11 allows operation over a wide range of output powers necessary for multiband operation. For example, GSM (global system for mobile communications) utilizes a very high output power and UMTS (universal mobile telecommunication system) utilizes a smaller output power. The transmitter allows output power that fills each requirement. The transmitter allows a very low output power for UMTS by activating the very small amplifier 414 in the center and deactivating amplifiers 410, 804, 412, 816 or a low power output for UMTS by activating one high power amplifier in each path (e.g., 410 and 412) and deactivating amplifiers 804, 816, and 414. The transmitter allows a very high power output for GSM by activating all four high power amplifiers 410, 804, 412, 816 (and deactivating 414).

Figure 12:
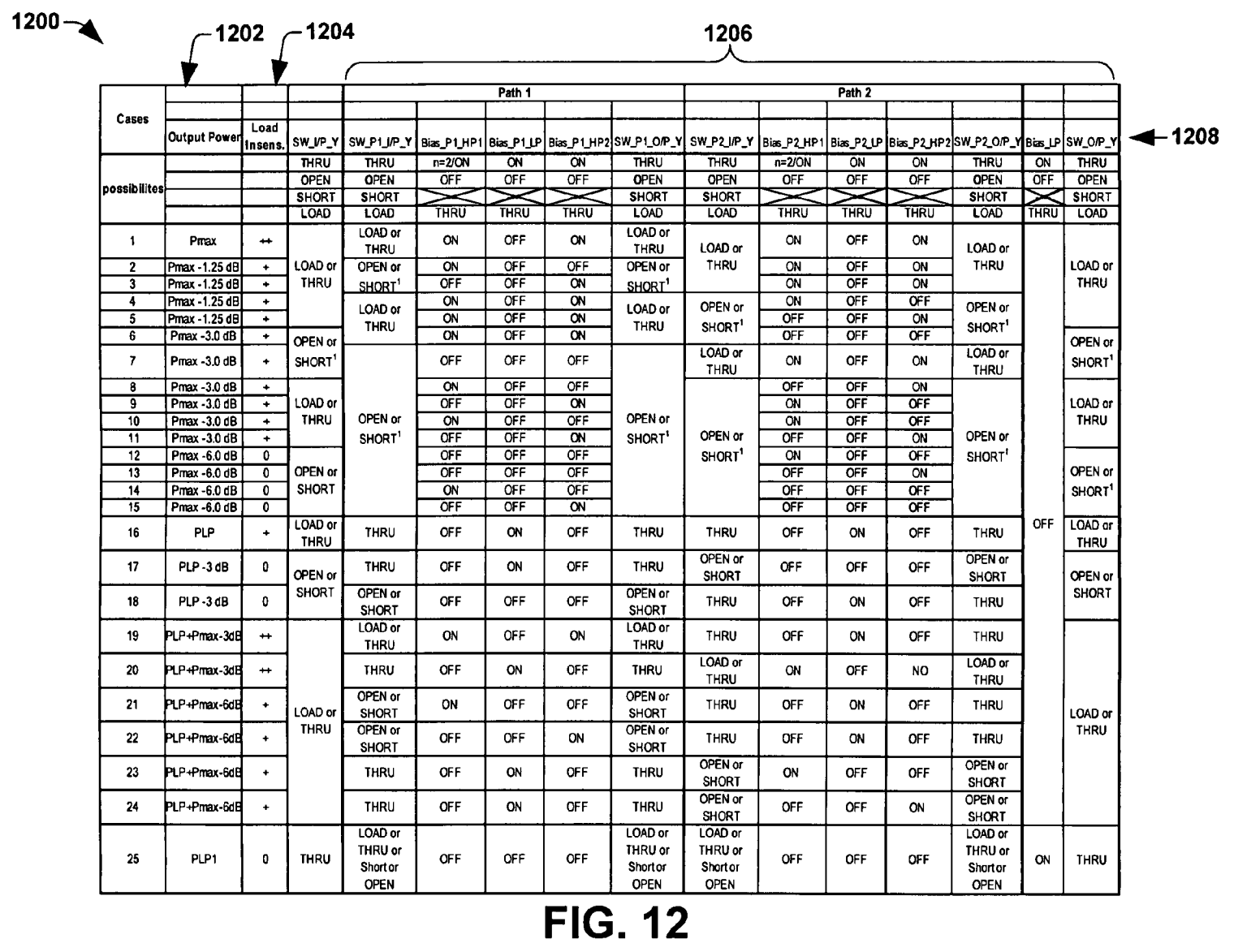

FIG. 12 shows a comprehensive table 1200 comprising twenty-five different operating modes (labeled cases in FIG. 12) for the amplifier of FIG. 11. These cases illustrate the different output powers the transmitter of FIG. 11 can output at high efficiency and load insensitive performance. The column labeled "output power" 1202 shows possible output power options (e.g., operation modes) decreasing from a largest output power $P_{max}$ to a lowest power mode PLP1. The load insensitive column 1204 shows how load insensitive the transmitter amplifiers are in the associated operation mode. In the load insensitive column "++" indicates that the amplifiers are very load insensitive, "+" indicates that the amplifiers are load insensitive, "0" means that the amplifiers are not load insensitive at all. Columns to the right of the load insensitive column (denoted as 1206) show the state of activation for the transmitter's amplifiers and switches that are required to provide a high efficiency for the power level given in the associated row, wherein the labels in the row marked 1208 correspond to labels shown in FIG. 11. For example, to operate the transmitter of FIG. 11 at an output power of $P_{max}$ with high efficiency and high load insensitivity switch SW_I/P_Y is set to load (L) or thru (T), switch SW_P1_I/P_Y is set to load (L) or thru (T), Bias_P1_HP1 is turned on, etc. Depending on the state of activation of the amplifiers and switches, the power amplifier of FIG. 11 can span a broad range of output power at improved performance. In particular, the present invention provides an output power at reduced output power (e.g., power below $P_{max}$) with higher efficiency (though still below optimum due to additional components and switches). For example, by operating at PLP (low power) mode the transmitter of FIG. 11 would have a much higher efficiency than a single high power amplifier operating at the same (low) output power.

In one application, a cellular phone utilizes the power amplifier of FIG. 11 to operate over a broad range of output powers required by UMTS. For example, for transmission far from a base station the phone would operate at maximum power ($P_{max}$) (e.g., case 1). However, most of the time, when closer to a base station, the phone would operate at 20 db below maximum power at low power mode (PLP) (e.g., case 16).

Figure 13:
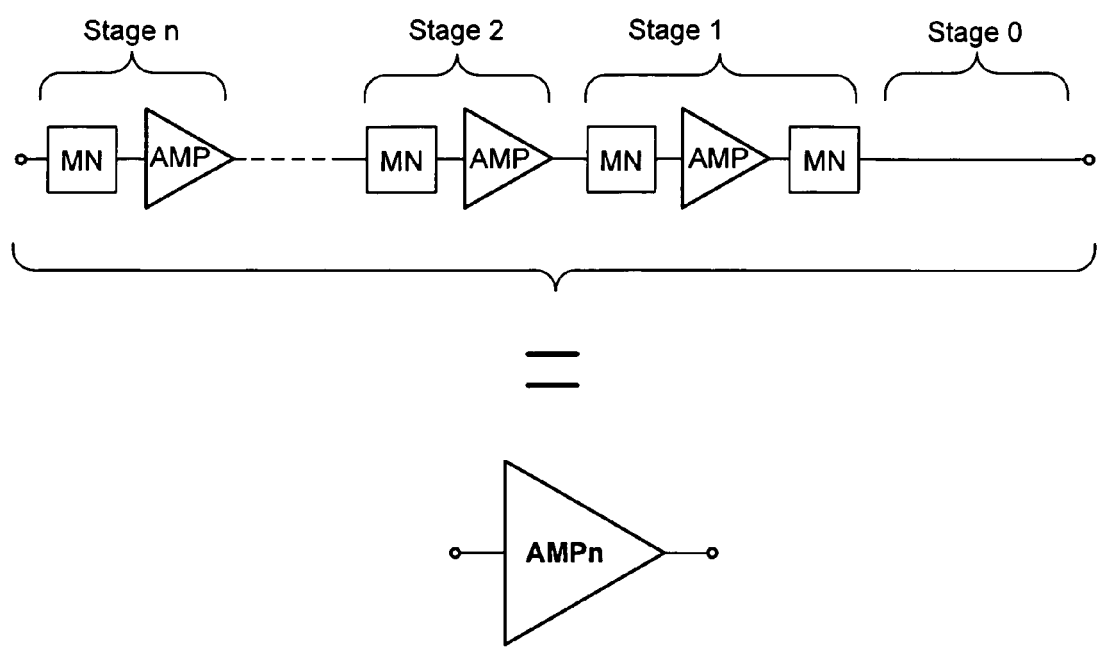
FIG. 13 is an exemplary illustration of a multistage amplifier and its equivalent schematic representation.

It will be appreciated that the term amplifier, as referred to in this disclosure and shown in the associated figures is meant to encompass one or more amplifiers. For example, as shown in FIG. 13 an amplifier may refer to more than one transistor amplifier consisting of several stages with matching networks. The inventors have contemplated the use of the disclosed invention with the use of a wide variety of amplifiers.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A power efficient transmitter with high dynamic range, comprising:
    a first amplification path configured to receive a first signal and output a first amplified signal to a first port of an output power combiner when activated and provide an impedance that results in a high reflection factor when deactivated;
    a second amplification path configured to receive a second signal with 90° phase shift with respect to the first signal and output a second amplified signal to a second port of the output power combiner when activated and provide an impedance that results in a high reflection factor when deactivated; and
    a third amplification path configured to receive a third signal and output a third amplified signal to a third port of the output power combiner when activated and provide an impedance that results in an impedance that matches the output impedance when deactivated;
    wherein the amplification paths are selectively activated and deactivated to output a received signal with high efficiency and linearity, and wherein the first and the second amplification path are concurrently activated or deactivated.

2. The transmitter of claim 1, wherein both the first signal and the second signal are high amplitude phase-modulated constant envelope signals and the third signal is an in-phase/quadrature phase modified low power signal.

3. The transmitter of claim 1, wherein the first amplification path and the second amplification path each comprise a first high power amplifier.

4. The transmitter of claim 3, wherein the first amplification path and the second amplification path each further comprise:
    a second high power amplifier;
    a first power combiner having a first input port configured to receive the first signal or the second signal, a first 0° phase port coupled to the first high power amplifier, a first 90° phase port coupled to the second high power amplifier, and a first isolation port; and
    a second power combiner having a second isolation port, a second 0° phase port coupled to the first high power amplifier, a second 90° phase port coupled to the second high power amplifier, and a second output port coupled to the output power combiner.

5. The transmitter of claim 4, wherein both the first amplification path and the second amplification path further comprise a first low power amplifier coupled to the output port of the first power combiner and the second isolation port.

6. The transmitter of claim 5, further comprising:
    a first switch connected to the first isolation port and the input of the first low power amplifier; and
    a second switch connected to the output of the first low power amplifier and the second isolation port;
    wherein both the first switch and the second switch are configured to provide a high reflection factor when the first low power amplifier is deactivated.

7. The transmitter of claim 1, wherein the third amplification path comprises a low power amplifier.

8. The transmitter of claim 7, wherein the third amplification path further comprises a switch coupled to the low power amplifier and an isolation port of the output power combiner.

9. The transmitter of claim 1, wherein an input power combiner receives an input signal and outputs the first signal, the second signal, or the third signal.

10. A power efficient transmitter with high dynamic range, comprising:
- a first amplification path configured to receive a first signal and output a first amplified signal to a first port of a output power combiner;
- a second amplification path configured to receive a second signal, phase shifted by 90° with respect to the first signal, and output a second amplified signal to a second port of the output power combiner;
- a third amplification path in parallel with the first and second amplification paths, and configured to receive a third signal and output a third amplified signal to an isolation port of the output power combiner; and
- a switch in the third amplification path configured to selectively provide an impedance in the third amplification path that matches substantially an output impedance of the third amplification path to the isolation port of the output power combiner.

11. A power efficient transmitter with high dynamic range, comprising:
- a first amplification path configured to receive a first signal and output a first amplified signal to a first port of a output power combiner;
- a second amplification path configured to receive a second signal, phase shifted by 90° with resect to the first signal, and output a second amplified signal to a second port of the output power combiner; and
- a switch configured to provide an impedance that matches the output impedance to an isolation port of the output power combiner, wherein the first amplification path comprises:
- a first high power amplifier;
- a second high power amplifier;
- a first low power amplifier;
- a first power combiner having a first input port configured to receive the first or second signal, a first 0° phase port coupled to the first high power amplifier, a first 90° phase port coupled to the second high power amplifier, and a first isolation port coupled to the first low power amplifier; and
- a second power combiner having, a second isolation port coupled to the first low power amplifier, a second 0° phase port coupled to the first high power amplifier, a second 90° phase port coupled to the second high power amplifier, and a second output port coupled to the output power combiner;
- wherein both the first high power amplifier and the second high power amplifier provide an impedance that results in a high reflection factor at the first and second 0° and 90° ports when deactivated, and wherein the first low power amplifier provides an impedance at the isolation port that matches the output impedance when deactivated.

12. The transmitter of claim 11, wherein the first amplification path further comprises:
- a first switch connected to the first isolation port and the input of the first low power amplifier; and
- a second switch connected to the output of the first low power amplifier and the second isolation port;
- wherein both the first switch and the second switch are configured to provide a high reflection factor when the first low power amplifier is deactivated.

13. The transmitter of claim 10, wherein the output power combiner is a hybrid power combiner.

14. The transmitter of claim 10, wherein the output power combiner is a ratrace power combiner.

15. A method of power efficient transmission, comprising:
- selectively separating a received signal into a first signal, a second signal having a 90° phase shift with respect to the first signal, or a third signal;
- performing high power transmission comprising:
  - concurrently amplifying both the first and second signals and outputting a first amplified signal to a first pod of an output power combiner and a second amplified signal to a second port of the output power combiner respectively;
  - providing an impedance of a third port of the output power combiner substantially equal to the output impedance of the output power combiner; and
  - combining the first and second amplified signals using the output power combiner to output the received signal amplified;
- performing low power transmission comprising:
  - amplifying the third signal and outputting a third amplified signal to a third port of the output power combiner; and
  - providing an impedance to the first and second ports of the output power combiner that results in a high reflection factor.

16. The method of claim 15, wherein both the first signal and the second signal are high amplitude phase-modulated constant envelope signals and the third signal is an in-phase/quadrature phase modified low power signal.

17. The method of claim 15, wherein amplifying the first signal further comprises:
- separating the first signal into a first high power component, a second high power component, or a low power component using an input power combiner;
- concurrently amplifying the first and second high power components; and
- combining the first and second amplified high power components.

18. The method of claim 17, further comprising outputting twenty-four different output voltages.

19. A method of power efficient transmission, comprising:
- separating a received signal into high power signals or low power signals;
- isolating the high power signals from the low power signals by selectively activating and deactivating amplifiers;
- concurrently amplifying two or more of the high power signals or one or more of the low power signals with activated amplifiers; and
- combining the isolated high power signals or the isolated low power signals to form the received signal amplified.

20. The method of claim 19, wherein isolating the high power signals from the low power signals is performed by switches configured to selectively provide power to the amplifiers, thereby activating or deactivating the amplifiers, respectively.

21. The method of claim 19, wherein isolating the high power signals from the low power signals is performed by directing the high power signals and the low power signals along different amplification paths, and selectively configuring amplifier impedance within the various amplification paths.

22. The method of claim 19, wherein selectively activating and deactivating amplifiers is performed by controlling an amplifier bias.

23. The method of claim 19, wherein selectively activating and deactivating amplifiers is performed by switches configured to selectively provide power to the amplifiers, thereby activating or deactivating the amplifiers, respectively.

24. A power efficient transmitter, comprising:
- separating means for separating a received signal into high power signals or low power signals;
- isolating means for isolating the high power signals from the low power signals;
- amplifying means for separately amplifying two or more of the high power signals or one or more of the low power signals; and
- combining means for combining the isolated high power signals or the isolated low power signals to form the received signal amplified.

25. The transmitter of claim 24, wherein the isolating means comprises selectively configuring an impedance associated with the amplifying means.

* * * * *